(12) United States Patent
Woo et al.

(10) Patent No.: US 9,023,221 B2
(45) Date of Patent: May 5, 2015

(54) METHOD OF FORMING MULTI-LAYER GRAPHENE

(75) Inventors: Yun-sung Woo, Yongin-si (KR);
 Jae-young Choi, Suwon-si (KR);
 Won-mook Choi, Hwaseong-si (KR);
 Hyeon-jin Shin, Suwon-si (KR);
 Seon-mi Yoon, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 239 days.

(21) Appl. No.: 13/451,775

(22) Filed: Apr. 20, 2012

(65) Prior Publication Data
US 2012/0267041 A1  Oct. 25, 2012

(30) Foreign Application Priority Data
Apr. 22, 2011 (KR) .......................... 10-2011-0037983

(51) Int. Cl.
| | |
|---|---|
| B44C 1/22 | (2006.01) |
| B32B 37/02 | (2006.01) |
| H01L 21/027 | (2006.01) |
| C01B 31/02 | (2006.01) |
| C01B 31/04 | (2006.01) |
| B82Y 30/00 | (2011.01) |
| B82Y 40/00 | (2011.01) |

(52) U.S. Cl.
CPC ............ B32B 37/02 (2013.01); H01L 21/0272 (2013.01); C01B 31/02 (2013.01); C01B 31/0453 (2013.01); *C01B 2204/02* (2013.01); *C01B 2204/04* (2013.01); B82Y 30/00 (2013.01); B82Y 40/00 (2013.01)

(58) Field of Classification Search
CPC ....................................................... C01B 31/02
See application file for complete search history.

(56) References Cited

U.S. PATENT DOCUMENTS

| | | | | |
|---|---|---|---|---|
| 5,773,122 A | * | 6/1998 | Lennox et al. ................ | 428/119 |
| 2009/0110627 A1 | * | 4/2009 | Choi et al. ................. | 423/447.1 |
| 2009/0199960 A1 | * | 8/2009 | Nuzzo et al. ................. | 156/230 |
| 2011/0048947 A1 | * | 3/2011 | Petronis et al. ............... | 204/483 |

FOREIGN PATENT DOCUMENTS

| | | |
|---|---|---|
| EP | 1840648 A1 * | 10/2007 |
| KR | 20090129176 A | 12/2009 |

OTHER PUBLICATIONS

Allen, M. et al., "Soft Transfer Printing Chemically Converted Graphene", Adv. Mater. 2009, 21, 2098-2102.
Lee, Y. et al., "Wafer-Scale Synthesis and Transfer of Graphene Films", Nano Lett. 2010, 10, 490-493, Jan. 4, 2010.

* cited by examiner

*Primary Examiner* — Shamim Ahmed
*Assistant Examiner* — Bradford Gates
(74) *Attorney, Agent, or Firm* — Harness, Dickey & Pierce, P.L.C.

(57) ABSTRACT

A method of forming a multi-layer graphene includes forming a stack of a graphitizing metal catalyst layer and graphene by repeatedly performing a cycle of first forming the graphitizing metal catalyst layer on a substrate, and then forming the graphene on the graphitizing metal catalyst layer, and removing the graphitizing metal catalyst layer.

14 Claims, 6 Drawing Sheets

METHOD OF FORMING MULTI-LAYER GRAPHENE

CROSS-REFERENCE TO RELATED APPLICATIONS

This application claims the benefit of Korean Patent Application No. 10-2011-0037983, filed on Apr. 22, 2011, in the Korean Intellectual Property Office, the disclosure of which is incorporated herein in its entirety by reference.

BACKGROUND

1. Field

Some example embodiments relate to methods of forming a multi-layer graphene, methods of forming a patterned multi-layer graphene, and/or methods of transferring a patterned graphene on a substrate.

2. Description of the Related Art

Graphene refers to a stack consisting of carbon atoms arranged in a hexagonal lattice structure that provide particular physical properties. First, graphene is chemically stable, and has an electrically semi-metallic property since a conductive band and a valance band overlap only at a Dirac point. Also, electron transportation on graphene has a ballistic property, and accordingly, an effective mass of electrons is zero. Thus, a transistor manufactured using graphene has relatively high mobility.

Also, graphene conducts a current density of 108 A/cm$^2$, which is about 100 times greater than the maximum current density of copper. In addition, graphene is optically transparent, and thus, a mono-layer graphene has a transparency of about 97.4%.

Due to such physical and optical properties of graphene, graphene is expected to be available for use in display devices, transparent electrodes or wiring of solar cells, and high performance transistors.

SUMMARY

Some example embodiments provide methods of forming a multi-layer graphene. Other example embodiments provide methods of forming a patterned multi-layer graphene. Other example embodiments provide methods of transferring a multi-layer graphene.

Additional aspects will be set forth in part in the description which follows and, in part, will be apparent from the description, or may be learned by practice of example embodiments.

According to an example embodiment, a method of forming a multi-layer graphene includes forming a stack of a graphitizing metal catalyst layer and graphene by repeatedly performing a cycle of first forming the graphitizing metal catalyst layer on a substrate, and then forming the graphene on the graphitizing metal catalyst layer, and removing the graphitizing metal catalyst layer.

According to another example embodiment, a method of forming a multi-layer graphene includes forming a stack of a graphitizing metal catalyst layer and graphene by repeatedly performing a cycle of first forming the graphitizing metal catalyst layer on a first substrate, and then forming the graphene on the graphitizing metal catalyst layer, forming a polymer support on the graphene, separating the stack of the graphitizing metal catalyst layer and the graphene and the polymer support from the first substrate, removing the graphitizing metal catalyst layer to form a stack of the graphene and the polymer support, transferring the stack of the graphene and the polymer support onto a second substrate, and removing the polymer support.

According to another example embodiment, a method of forming a multi-layer graphene includes forming a block layer on a substrate, patterning the block layer to form a patterned block layer, forming a stack of a graphitizing metal catalyst layer and graphene by repeatedly performing a cycle of first forming the graphitizing metal catalyst layer on the patterned block layer and then forming the graphene on the graphitizing metal catalyst layer, removing the patterned block layer, and removing the graphitizing metal catalyst layer.

According to another example embodiment, a method of forming a patterned multi-layer graphene includes forming a block layer on a first substrate, patterning the block layer to form a patterned block layer, forming a stack of a graphitizing metal catalyst layer and graphene by repeatedly performing a cycle of first forming the graphitizing metal catalyst layer on the first substrate including the patterned block layer formed thereon and then forming the graphene on the graphitizing metal catalyst layer, removing the patterned block layer, forming a polymer support on the graphene, separating the stack of the graphitizing metal catalyst layer and the graphene and the polymer support from the first substrate, removing the graphitizing metal catalyst layer, transferring the stack of the graphene and the polymer support onto a second substrate, and removing the polymer support.

According to another example embodiment, a method of forming a multi-layer graphene includes placing a substrate into a process chamber, and the substrate includes a graphitizing metal catalyst layer formed thereon. A graphene stack structure is formed on the graphitizing metal catalyst layer by simultaneously providing a vaporous carbon supplier to the process chamber and heat treating the graphitizing metal catalyst layer. The graphitizing metal catalyst layer is removed.

BRIEF DESCRIPTION OF THE DRAWINGS

These and/or other aspects will become apparent and more readily appreciated from the following description of the embodiments, taken in conjunction with the accompanying drawings of which.

DETAILED DESCRIPTION

Reference will now be made in detail to embodiments, examples of which are illustrated in the accompanying drawings, wherein like reference numerals refer to like elements throughout. In this regard, example embodiments may have different forms and should not be construed as being limited to the descriptions set forth herein. Accordingly, example embodiments are merely described below, by referring to the figures, to explain the inventive concepts.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein the term "and/or" includes any and all combinations of one or more of the associated listed items.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing exemplary embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

<Formation of Multi-Layer Graphene>

Figure 1A:
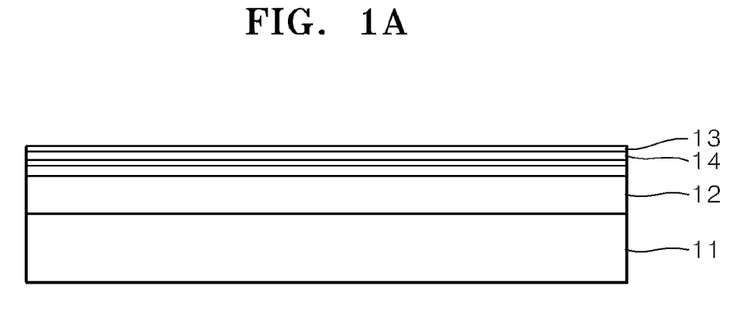
FIG. 1A is a cross-sectional view of a multi-layer graphene according to an example embodiment.

FIG. 1A is a view for explaining a method of forming a multi-layer graphene, according to an example embodiment. Referring to FIG. 1A, in order to form the multi-layer graphene, a graphitizing metal catalyst layer 14 is formed on a substrate 11, a graphene 13 is formed thereon, and this process is repeatedly performed to form a stack of the graphitizing metal catalyst layer 14 and the graphene 13. Subsequently, the graphitizing metal catalyst layer 14 may be removed. A block layer 12 illustrated in FIG. 1A may be optionally used if needed, and will be described below.

The graphitizing metal catalyst layer 14 may be formed by depositing a graphitizing metal catalyst on the substrate 11 by using various methods, for example, atomic layer deposition, thermal oxidation, or sputtering. In this case, a thickness of the graphitizing metal catalyst layer 14 may be, for example, about 100 nm to about 1,000 nm.

The graphitizing metal catalyst deposited on the substrate 11 contacts a carbon supplier to facilitate combination of carbonaceous components supplied from a carbon supplier into a hexagonal planar structure. Examples of the graphitizing catalyst metal are a catalyst that is used to synthesize graphite, a catalyst for inducing carbonation, and a catalyst that is used to prepare carbon nanotubes. For example, the graphitizing metal catalyst includes one or more metals selected from the group consisting of nickel (Ni), cobalt (Co), iron (Fe), platinum (Pt), gold (Au), aluminum (Al), chromium (Cr), palladium (Pd), copper (Cu), magnesium (Mg), manganese (Mn), molybdenum (Mo), rhodium (Rh), silicon (Si), tantalum (Ta), titanium (Ti), tungsten (W), uranium (U), vanadium (V), and zirconium (Zr). The graphitizing metal catalyst layer 14 may have a planar structure formed of only the metals as described above.

A thickness of the graphitizing metal catalyst layer 14 may be from about 100 nm to about 1,000 nm, for example, from about 300 nm to about 500 nm, and within such ranges, catalyst activity may be sufficiently induced to form graphene.

After the graphitizing metal catalyst layer 14 is formed on the substrate 11, a vaporous carbon supplier is provided thereto while heat treating to form graphene. Then, the graphene is allowed to grow uniformly by cooling, thereby forming graphene having a dense structure.

Figure 1B:
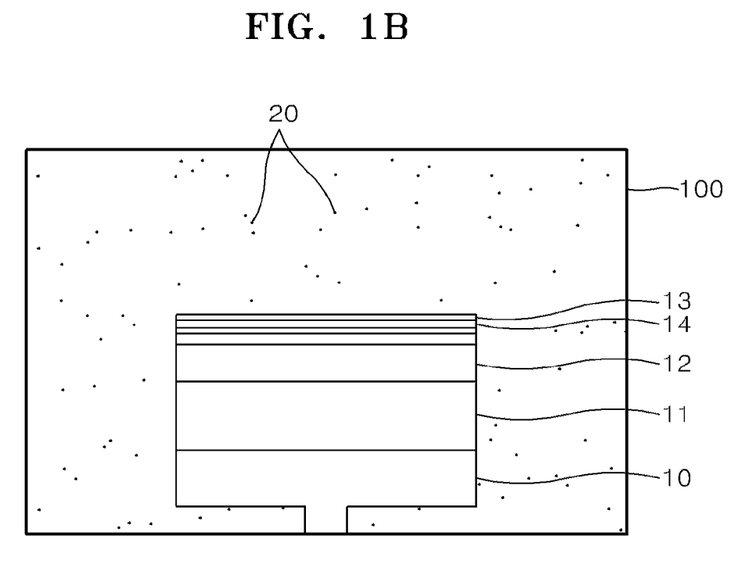
FIG. 1B is a view of a process chamber used in a method of forming a multi-layer graphene according to an example embodiment.

FIG. 1B is a view of a process chamber used in a method of forming a multi-layer graphene according to an example embodiment. In FIG. 1B, when a vaporous carbon supplier 20 is provided under a given (or alternatively, predetermined) pressure to a process chamber 100 in which the graphitizing metal catalyst layer 14 is placed, while heat treating at a given (or alternatively, predetermined) temperature, carbonaceous components contained in the vaporous carbon supplier 20 are activated and combined with each other on the graphitizing metal catalyst layer 14 to form a hexagonal planar structure, thereby forming graphene, and the graphene is cooled at a given (or alternatively, predetermined) rate to form a graphene layer having a uniform arrangement state.

The vaporous carbon supplier 20 used in forming graphene may be any one of various materials that supply carbon and are present in a vapor phase at a temperature equal to or higher than 300° C. The vaporous carbon supplier 20 may be a compound including carbon atoms, and examples thereof are a compound having 6 or less carbon atoms, 4 or less carbon atoms, or 2 or less carbon atoms. The vaporous carbon supplier 20 may include at least one selected from the group consisting of carbon mono-oxide, methane, ethane, ethylene, ethanol, acetylene, propane, propylene, butane, butadiene, pentane, pentene, cyclopentadiene, hexane, cyclohexane, benzene, and toluene. However, the vaporous carbon supplier 20 is not limited thereto.

The vaporous carbon supplier 20 may be provided to the chamber 100 containing a graphitizing catalyst under a constant pressure, and in the chamber, only the vaporous carbon supplier 20 may be present, or the vaporous carbon supplier may be present in combination with an inert gas (not shown), e.g., helium or argon.

Also, the vaporous carbon supplier 20 may be used together with hydrogen, which is used to control a vapor-phase reaction by maintaining a clean surface of the graphitizing metal catalyst. An amount of hydrogen in the vapor may be from about 5 to about 40 volume %, for example, about 10 to about 30 volume % or about 15 to about 25 volume %, based on the whole chamber volume.

When the vaporous carbon supplier 20 is provided to the chamber 100 containing the graphitizing metal catalyst and heat treated at a given (or alternatively, predetermined) temperature, graphene is formed on the graphitizing metal catalyst layer 14. The heat treatment temperature is a critical factor in producing graphene, and may be, for example, from about 300 to about 2000° C., or about 500 to about 1,500° C. Within the heat treatment temperature ranges, graphene may be formed in a layer structure, not a particle or fiber structure.

By performing the heat treatment at a given (or alternatively, predetermined) temperature for a given (or alternatively, predetermined) period of time, an amount of graphene formed may be controllable. That is, if the heat treatment time is longer, more graphene is generated, thereby resulting in a graphene sheet having a relatively great thickness. On the other hand, if the heat treatment time is shorter, the resultant graphene sheet may have a relatively small thickness. Accordingly, in forming a graphene sheet having a target thickness, a heat treatment time may also be considered as a critical factor, in addition to a carbon supplier, a supply pressure of the carbon supplier, a graphitizing metal catalyst, a graphitizing metal catalyst thickness, and a size of a chamber used. The heat treatment time may be, in general, from about 0.001 to about 1,000 hours, and within the time range, graphene may be appropriately formed.

As a heat source for the heat treatment, one of induction heating, radiation heat, laser, IR light, microwaves, plasma, ultraviolet (UV) light, and/or surface plasmon heating, may be used without limitation. Such heat sources may be applied to the chamber 100 so as to increase the temperature inside the chamber 100 to a given (or alternatively, predetermined) temperature.

After the heat treatment, a heat treatment product is subjected to a cooling process. The cooling is performed to allow formed graphene to uniformly grow and regularly align. If the cooling is performed quickly, a formed graphene sheet may have cracks. Accordingly, the cooling may be slowly performed at a constant rate, for example, a temperature decrease rate of 10° C. to 100° C. per minute. Alternatively, the cooling may be natural cooling. The natural cooling may be performed by either the stoppage of a heat source used to perform a heat treatment or simply removing the used heat source. As described above, the removal of a heat source may be sufficient to obtain a sufficient cooling rate.

The graphene sheet obtained after the cooling process may have a 1 to 50-layer structure or a 1 to 10-layer structure. As described above, a cycle of the heat treating and cooling may be performed once, or the cycle may be repeatedly performed to form a dense multi-layer graphene.

The substrate 11 may be an inorganic substrate, e.g., a silicon substrate, a glass substrate, a GaN substrate, or a silica substrate, or a metal substrate, e.g., a nickel (Ni) substrate, a copper (Cu) substrate, or a tungsten (W) substrate. If the substrate 11 is a silica substrate, a surface of the silica substrate may be coated with the block layer 12 to suppress an unnecessary reaction between the silica substrate and the graphitizing catalyst. Since the block layer 12 is located between the substrate 11 and the graphitizing metal catalyst layer 14, a decrease in graphene generation efficiency due to a reaction between the graphitizing metal catalyst and the substrate 11 may be reduced. The block layer 12 may include $SiO_2$, TiN, $Al_2O_3$, $TiO_2$, and/or $Si_3N_4$, and formation thereof on the substrate 11 may be performed by, for example, sputtering. A thickness of the block layer 12 may be from about 1 nm to about 100 μm.

As described above, after the graphitizing metal catalyst layer 14 is formed on the substrate 11, the graphene 13 may be formed thereon. When this process is repeatedly performed, a stack of metal catalyst layer/graphene/metal catalyst layer/graphene may be formed on the substrate 11.

By repeatedly performing the process of forming the graphitizing metal catalyst layer 14 and the graphene 13, the number of layers that form a final multi-layer graphene and a thickness of the final multi-layer graphene may vary. The repetition number of the process of forming the graphitizing metal catalyst layer 14 and the graphene 13 may be from 2 to 100.

After the stack is formed as described above, the graphitizing metal catalyst layers 14 are removed to form a stack formed of graphene.

The graphitizing metal catalyst layer 14 may be removed through, for example, an acid treatment or an evaporation treatment. The acid treatment is a process for dissolving and removing a graphitizing catalyst and is performed by immersing a substrate on which a stack is formed in a given (or alternatively, predetermined) concentration of an acid for a given (or alternatively, predetermined) period of time. The concentration and the immersion time may be appropriately controlled to a level at which a graphitizing catalyst is dissolved and removed. An acid for use in the acid treatment may be a weak acid, or a strong acid, and examples of the acid are a sulfuric acid, a hydrochloric acid, or a nitric acid.

The evaporation treatment is a process for performing a heat treatment under a vacuum condition to remove a graphitizing metal catalyst by evaporation.

According to the processes as described above, a multi-layer graphene, which is a stack formed of graphene, is formed on a substrate, and the multi-layer graphene may be more easily formed compared to a multi-layer graphene that is formed by repeatedly performing a transferring process. Also, the residue may not remain, and thus, the uniformity of graphene may be improved. Accordingly, defects of a final multi-layer graphene may be minimized or reduced, and also, the transmittance and conductivity of graphene may be improved.

<Forming and Transferring Multi-Layer Graphene>

A multi-layer graphene may be transferred on other substrates, for example, an insulating substrate, and to do this, a polymer support may be used before a graphitizing metal catalyst layer is removed.

A graphitizing metal catalyst layer is formed on a first substrate, and graphene is formed thereon. The process for forming the graphitizing metal catalyst layer and the graphene is repeatedly performed to form a stack. The process for forming the graphitizing metal catalyst layer and the graphene on the first substrate is the same as already described above.

Subsequently, a polymer support is formed on a stack of first substrate/metal catalyst layer/graphene/metal catalyst layer/graphene. The polymer support may be formed by coating a first organic solvent, in which a polymer, e.g., polymethyl methacrylate, polystyrene, or polypropylene, is dissolved, on the stack and evaporating the organic solvent. Examples of the first organic solvent are chlorobenzene, acetone and/or toluene, and an amount of the polymer may be from about 1 to about 20 parts by weight, or about 1 to 10 parts by weight, based on 100 parts by weight of the first organic solvent.

A tape, for example, a Scotch® tape, a thermal release tape, or an ultraviolet UV tape, is attached to the polymer support.

Also, by using a weak adhesive force between the first substrate and a metal catalyst layer adjacently located thereto, a metal catalyst layer/graphene/metal catalyst layer/graphene . . . /polymer support/tape stack is separated from the first substrate. The separated metal catalyst layer/graphene/metal catalyst layer/graphene . . . /polymer support/tape stack is treated with an etchant to remove the metal catalyst layers, the remaining graphene/graphene . . . /polymer support/tape stack is transferred on a second substrate, and the polymer support is removed by using a second organic solvent. Thus, only a multi-layer graphene on the second substrate remains.

The second organic solvent may be acetone, chlorobenzene, or toluene, but is not limited thereto. The second organic solvent may be any one of various solvents that dissolve and remove the polymer.

The second substrate may be determined according to purpose, and may be, for example, any one of a metal oxide-based substrate, a silica-based substrate, a nitrogen boride-based substrate, and a silicon-based substrate, or a stack of two or more thereof. The metal oxide-based substrate may include, for example, $Al_2O_3$, sapphire, $TiO_2$, ZnO, $ZrO_2$, or $HfO_2$. The nitrogen boride-based substrate may include, for example, h-BN. The silica-based substrate may include, for example, $SiO_2$, glass, or quartz. The silicon-based substrate may include, for example, Si(111), Si(100), or p-Si.

The etchant may be any one of various materials that dissolve the metal catalyst layer. For example, when a nickel metal is used, $FeCl_3$ or a commercially available product (product name, CE-100, manufactured by Transene Co. Inc) may be used.

<Manufacturing of Patterned Multi-Layer Graphene>

A multi-layer graphene may be formed having a pattern. The block layer 12 formed on the substrate 11 is patterned by photolithography and etching. As photolithography and etching methods, any conventionally known methods may be used according to a block layer without limitation. For example, graphene may be patterned by etching, e.g., reactive ion etching (RIE), after an etching mask is formed by patterning a photoresist by photolithography.

Since the block layer 12 is located between the substrate 11 and the graphitizing metal catalyst layer 14, the block layer 12 acts as a function layer for suppressing a decrease in graphene generation efficiency due to a reaction between a graphitizing catalyst and the substrate 11. Also, by patterning the block layer 12, graphene that is formed in a subsequent process may also have a pattern. The block layer 12 may include $SiO_2$, TiN, $Al_2O_3$, $TiO_2$, or $Si_3N_4$, and may be formed on the substrate 11 by, for example, sputtering. The block layer 12 may have a given (or alternatively, predetermined) thickness, for example, about 1 nm to about 100 μm.

Figure 2A:
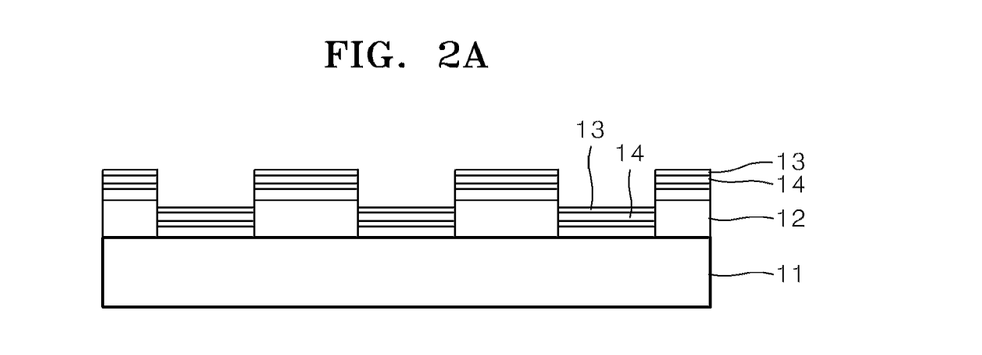
FIGS. 2A-2C are views for explaining a method of forming a multi-layer graphene according to an example embodiment.

As illustrated in FIG. 2A, the graphitizing metal catalyst layer 14 is formed on the patterned block layer 12, and the graphene 13 is formed thereon. According to a pattern type, the graphitizing metal catalyst layer 14 and the graphene 13 formed thereon may be formed directly on the substrate 11, or may be discontinuously formed on the patterned block layer 12.

Figure 2B:
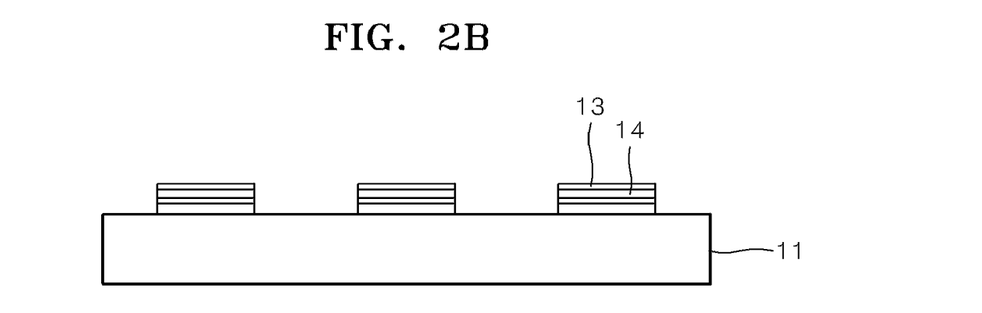

The process for forming the graphitizing metal catalyst layer 14 and the graphene 13 is repeatedly performed to form a stack. Subsequently, in FIG. 2B, the patterned block layer 12 is removed. In this case, the graphitizing metal catalyst layer 14 and the graphene 13 formed on the patterned block layer 12 may also be removed together with the patterned block layer 12. When the block layer 12 is formed of $SiO_2$, an $NH_3F$-buffered hydrofluoric acid (BOE, $H_2O$+HF+$NH_3OH$) may be used to remove the block layer 12.

Figure 2C:
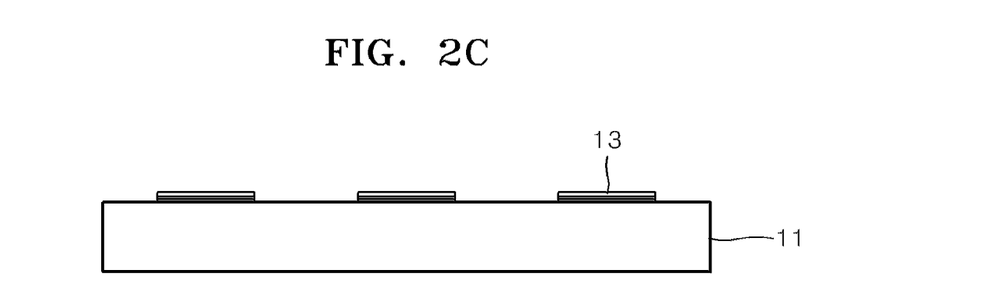

Subsequently, in FIG. 2C, the graphitizing metal catalyst layer 14 is removed by using an acid treatment or an evaporation treatment, thereby forming a patterned multi-layer graphene on the substrate 11.

The process for forming the graphitizing metal catalyst layer 14 and the graphene 13, repeating of the process, and removing of the graphitizing metal catalyst are the same as presented above.

A patterned graphene formed through the processes as described above is less defective since graphene is directly formed on a substrate. Also, through the processes as described above, high-density graphene may be efficiently formed and the number of layers that constitute graphene may be easily controllable.

<Transferring of Patterned Multi-Layer Graphene>

A patterned multi-layer graphene may be transferred on other substrates. The block layer 12 formed on the first substrate 11 is patterned by photolithography and etching. As photolithography and etching methods, any conventionally known methods may be used according to a block layer without limitation. For example, graphene may be patterned by etching, e.g., RIE, after an etching mask is formed by patterning a photoresist by photolithography.

Figure 3A:
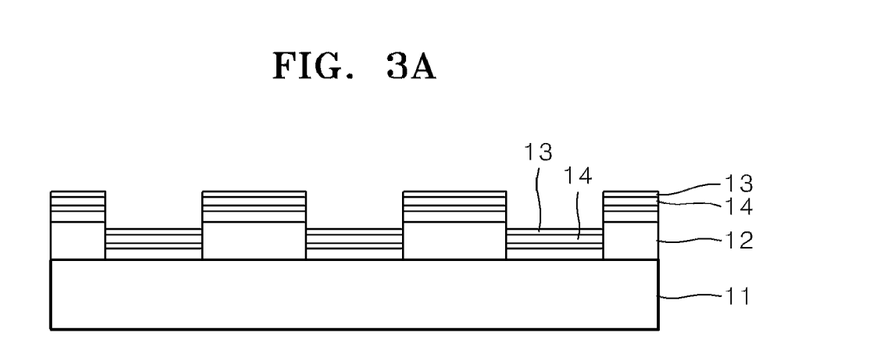
FIGS. 3A-3F are views for explaining a method of forming a multi-layer graphene according to an example embodiment.

Subsequently, as illustrated in FIG. 3A, the graphitizing metal catalyst layer 14 is formed on the resultant pattern, and the graphene 13 is formed thereon. According to a pattern type, the graphitizing metal catalyst layer 14 and the graphene 13 formed thereon may be formed directly on the first substrate 11, or may be discontinuously formed on the patterned block layer 12. The process for forming the graphitizing metal catalyst layer 14 and the graphene 13 is repeatedly performed to form a patterned stack. The process for forming the graphitizing metal catalyst layer 14 and the graphene 13 is already described in detail above.

Figure 3B:
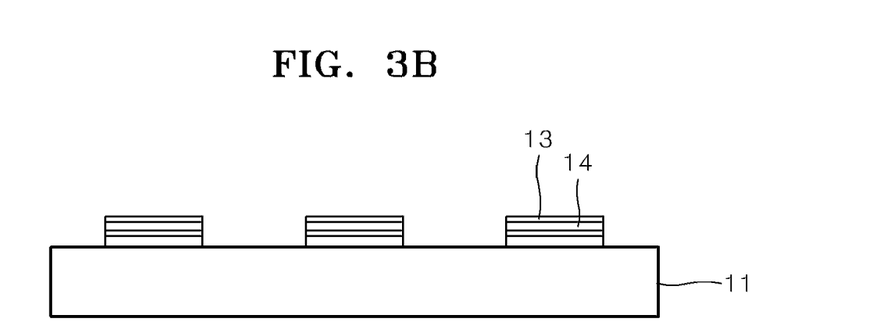

In FIG. 3B, the patterned block layer 12 is removed. In this case, the graphitizing metal catalyst layer 14 and the graphene 13 formed on the patterned block layer 12 may also be removed together with the patterned block layer 12. When the block layer 12 is formed of $SiO_2$, an $NH_3F$-buffered hydrofluoric acid (BOE, $H_2O$+HF+$NH_3OH$) may be used to remove the block layer 12.

Figure 3C:
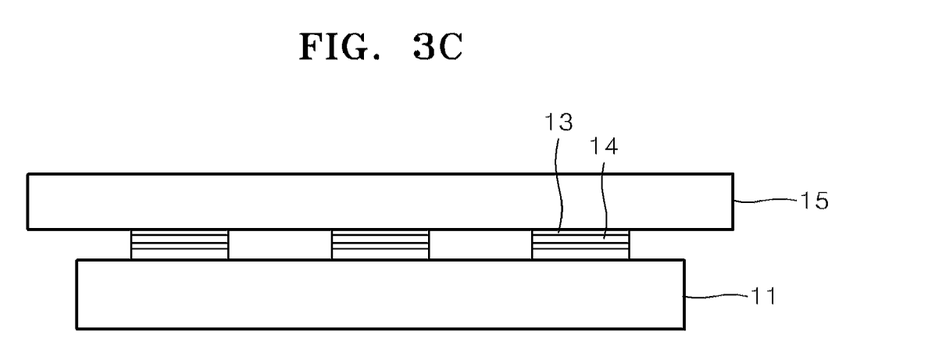

In FIG. 3C, a polymer support 15 is formed on a first substrate/metal catalyst layer/graphene/metal catalyst layer/ graphene stack. The polymer support 15 may be formed by coating a first organic solvent, in which a polymer, e.g., polymethyl methacrylate, polystyrene, and/or polypropylene, is dissolved, on the stack and evaporating the organic solvent. Examples of the first organic solvent are chlorobenzene, acetone, and/or toluene, and an amount of the polymer may be from about 1 to about 20 parts by weight, or about 1 to 10 parts by weight, based on 100 parts by weight of the first organic solvent.

Figure 3D:
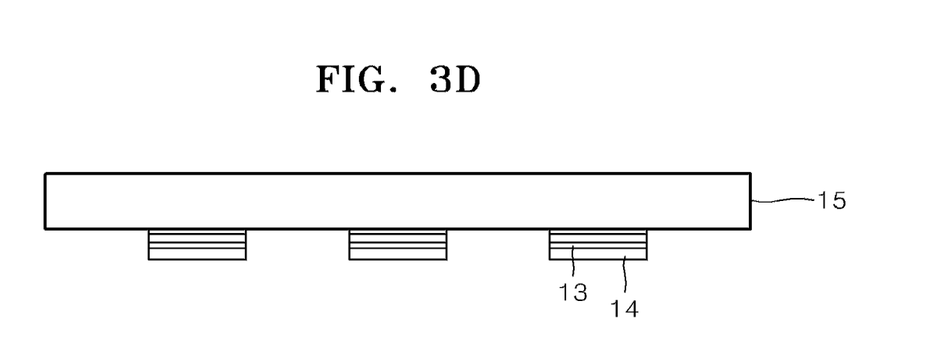
Figure 3E:
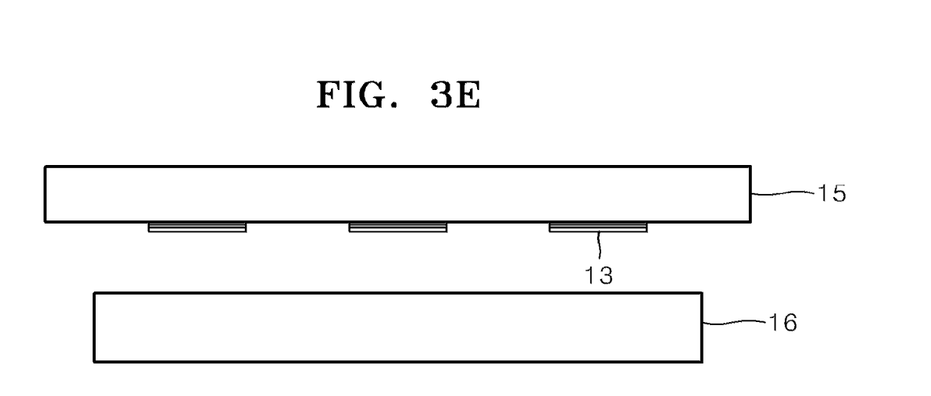
Figure 3F:
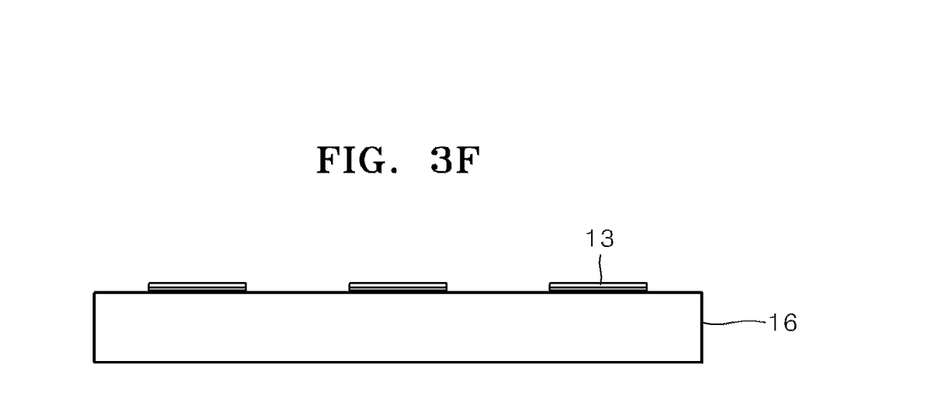

A tape (not shown), for example, a Scotch® tape, a thermal release tape, or an UV tape, is attached to the polymer support 15. And, by using a weak adhesive force between the first substrate and a metal catalyst layer adjacently located thereto, the metal catalyst layer/graphene/metal catalyst layer/graphene . . . /polymer support/tape stack is separated from the first substrate 11 as shown in FIG. 3D. The separated metal catalyst layer/graphene/metal catalyst layer/graphene . . . /polymer support/tape stack is treated with an etchant to remove the metal catalyst layers as shown in FIG. 3E, and the remaining graphene/graphene . . . /polymer support/tape stack is transferred on a second substrate 16 as shown in FIG. 3F. The polymer support is removed by using a second organic solvent, and thus, only the multi-layer graphene on the second substrate remains.

The second organic solvent may be acetone, chlorobenzene, and/or toluene, but is not limited thereto. The second organic solvent may be any one of various solvents that dissolve and remove the polymer.

The second substrate 16 may be determined according to purpose, and may be, for example, any one of a metal oxide-based substrate, a silica-based substrate, a nitrogen boride-based substrate, and a silicon-based substrate, or a stack of two or more thereof. The metal oxide-based substrate may include, for example, $Al_2O_3$, sapphire, $TiO_2$, ZnO, $ZrO_2$, or $HfO_2$. The nitrogen boride-based substrate may include, for example, h-BN. The silica-based substrate may include, for example, $SiO_2$, glass, or quartz. The silicon-based substrate may include, for example, Si(111), Si(100), or p-Si.

The etchant may be any one of various materials that dissolve the metal catalyst layer. For example, when a nickel metal is used, $FeCl_3$ or a commercially available product (product name, CE-100, manufactured by Transene Co. Inc) may be used.

By using the method of forming a multi-layer graphene as described above, a multi-layer graphene may be more easily formed and patterned on a substrate, and the formed multi-layer graphene may be transferred on a substrate while defects or the residue are minimized or reduced.

Accordingly, a polymer residue, which brings about problems when a multi-layer graphene is formed by repeatedly performing a conventional transferring process, may be minimized or reduced, thereby maintaining the unique characteristics of graphene. Also, in the conventional art, when a patterned multi-layer graphene is formed, it is difficult to transfer a graphene layer on the same position. Due to the difficulty, graphene layers are deposited in the whole area and then patterning is performed thereon using oxygen plasma, thereby complicating the manufacturing process. However, according to some example embodiments, a patterned multi-layer graphene including a target number of graphene layers may be formed by using a relatively simple process. In this case, the graphene may have a 2 to 100-layer structure.

Accordingly, since graphene retains its unique transmittance and conductivity, graphene may be used in various display devices, transparent electrodes, wiring, and/or transistors.

Some example embodiments will now be described in further detail with reference to the following examples. These examples are for illustrative purposes only and are not intended to limit the scope of the example embodiments.

Example 1

Copper was deposited by sputtering on a 2 cm×2 cm silicon substrate on which $SiO_2$ was coated to a thickness of 100 nm, thereby forming a copper film having a thickness of 2 μm. The silicon substrate on which $SiO_2$ and the copper film were deposited was placed in a chamber, and heat treated with 4 sccm of $H_2$ at a temperature of 1,000° C. for 30 minutes, and then 20 sccm of $CH_4$ and 4 sccm of $H_2$ were loaded thereinto for 30 minutes and the inside of the chamber was naturally cooled to form a mono-layer graphene having a size of 2 cm×2 cm.

Subsequently, copper was deposited on the graphene by sputtering so as to form a copper film having a thickness of 1 μm. The silicon substrate on which the $SiO_2$/copper film/graphene/copper film structure was disposed was placed in a chamber, and heat treated with 4 sccm of $H_2$ at a temperature of 1,000° C. for 30 minutes, and then 20 sccm of $CH_4$ and 4 sccm of $H_2$ were loaded thereinto for 30 minutes and the inside of the chamber was naturally cooled to form a mono-layer graphene having a size of 2 cm×2 cm.

Then, a chlorobenzene solution (5 wt. %) in which polymethylmethacrylate (PMMA) was dissolved was coated on the silicon substrate on which graphene was formed at a rate of 1,000 rpm for 60 seconds, and then a UV tape was attached thereon. Then, by using a weak adhesive force between the $SiO_2$ and the copper film, the copper film/graphene/copper film/graphene/PMMA/UV tape stack was separated from the silicon substrate.

Then, the copper film/graphene/copper film/graphene/PMMA/UV tape stack was immersed in an etchant (CE-100, manufactured by Transene Co. Inc) for 1 hour to remove the copper films, thereby producing a UV tape/PMMA/graphene double-layer stack.

Then, the UV tape/PMMA/graphene double-layer stack was transferred on a $SiO_2$ substrate while the graphene contacted the $SiO_2$ substrate, and then PMMA was removed using acetone, thereby forming the graphene double-layer on the $SiO_2$ substrate.

Figure 4:
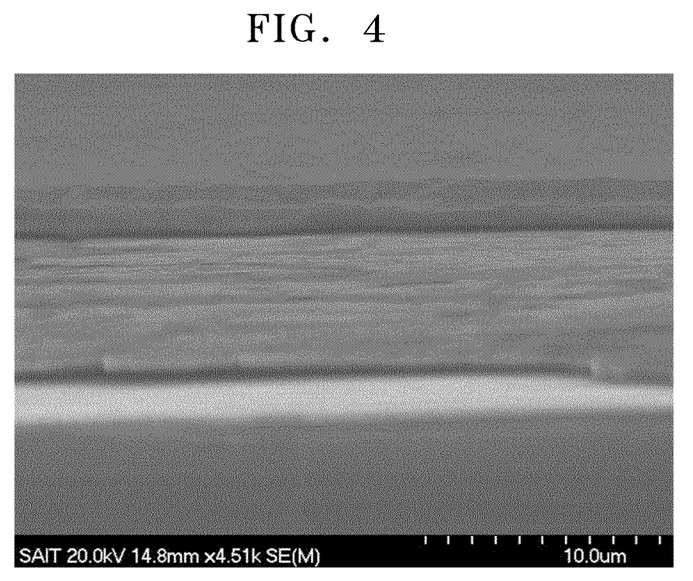
FIG. 4 is a scanning electron microscopy (SEM) image of a cross-section of a graphene double-layer formed on a copper film.

FIG. 4 is a scanning electron microscopy (SEM) image of a cross-section of the graphene double-layer formed on the copper film, which confirms that the multi-layer graphene was formed.

Figure 5:
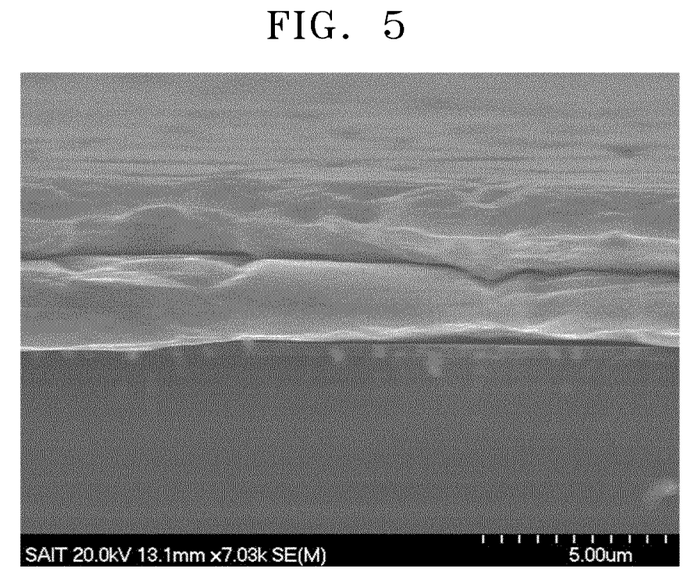
FIG. 5 is a SEM image of a cross-section of a structure including two graphene mono layers formed on copper films.

FIG. 5 is a SEM image of a cross-section of a structure including two graphene mono-layers formed on copper films, which confirms that the multi-layer graphene was formed.

Figure 6:
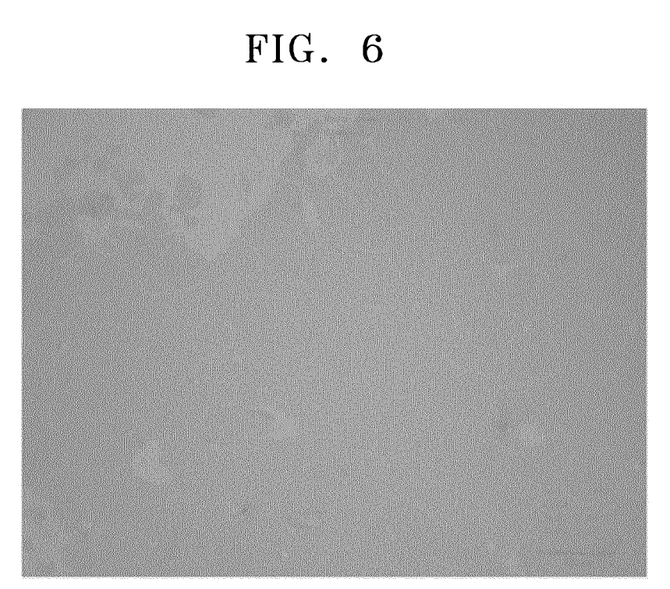
FIG. 6 shows an optical image of a surface of a graphene mono-layer that is transferred on a SiO$_2$ substrate after removal of copper films.

FIG. 6 shows an optical image of a surface of a graphene mono-layer that was transferred on a $SiO_2$ substrate after removal of copper films.

Figure 7:
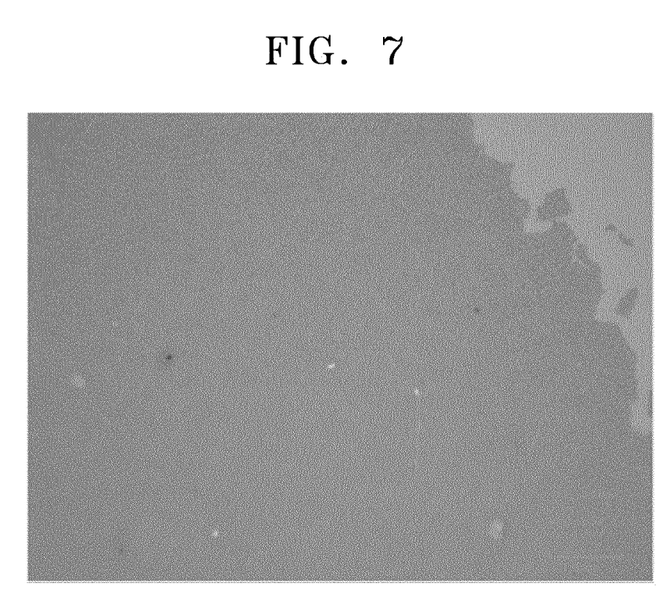
FIG. 7 shows an optical image of a surface of a graphene double-layer that is transferred on a SiO$_2$ substrate after removal of copper films.

FIG. 7 shows an optical image of a surface of a graphene double-layer that was transferred on a $SiO_2$ substrate after removal of copper films.

Example 2

A 2 cm×2 cm silicon substrate on which $SiO_2$ was coated to a thickness of 100 nm was patterned by RIE after photolithography.

Then, copper was deposited thereon by sputtering to form a copper film having a thickness of 2 μm. The resultant silicon substrate on which the $SiO_2$ and the copper film were patterned was placed in a chamber, and heat treated with 4 sccm of H₂ at a temperature of 1,000° C. for 30 minutes, and then 20 sccm of CH₄ and 4 sccm of H₂ were loaded thereinto for 30 minutes, and the inside of the chamber was naturally cooled to form a mono-layer graphene having a size of 2 cm×2 cm.

Then, copper was deposited on the graphene by sputtering so as to form a patterned copper film having a thickness of 1 μm. The silicon substrate on which the SiO₂/copper film/graphene/copper film structure was formed was placed inside the chamber, heat treated with 4 sccm of H₂ at a temperature of 1,000° C. for 30 minutes, and then 20 sccm of CH₄ and 4 sccm of H₂ were loaded thereinto for 30 minutes, and the inside of the chamber was naturally cooled to form a mono-layer graphene having a size of 2 cm×2 cm.

Then, NH₃F-buffered hydrofluoric acid (BOE) was used to remove the patterned SiO₂, and simultaneously, the copper film and graphene which were formed thereon were removed.

Then, the patterned copper film/graphene/copper film/graphene structure formed on the silicon substrate was immersed together with the silicon substrate in an etchant (CE-100, manufactured by Transene Co. Inc) for 1 hour so as to remove the copper films, thereby producing a patterned graphene double-layer on the silicon substrate.

Example 3

A 2 cm×2 cm silicon substrate on which SiO₂ was coated to a thickness of 100 nm was patterned by RIE after photolithography.

Then, copper was deposited thereon by sputtering to form a copper film having a thickness of 2 μm. The resultant silicon substrate on which the SiO₂ and the copper film were patterned was placed in a chamber, and heat treated with 4 sccm of H₂ at a temperature of 1,000° C. for 30 minutes, and then 20 sccm of CH₄ and 4 sccm of H₂ were loaded thereinto for 30 minutes, and the inside of the chamber was naturally cooled to form a mono-layer graphene having a size of 2 cm×2 cm.

Then, copper was deposited on the graphene by sputtering so as to form a patterned copper film having a thickness of 1 μm. The silicon substrate on which the SiO₂/copper film/graphene/copper film structure was formed was placed inside the chamber, heat treated with 4 sccm of H₂ at a temperature of 1,000° C. for 30 minutes, and then 20 sccm of CH₄ and 4 sccm of H₂ were loaded thereinto for 30 minutes, and the inside of the chamber was naturally cooled to form a mono-layer graphene having a size of 2 cm×2 cm.

Then, NH₃F-buffered hydrofluoric acid (BOE) was used to remove the patterned SiO₂, and simultaneously, the copper film and graphene which were formed thereon were removed.

Then, a chlorobenzene solution (5 wt. %) in which PMMA was dissolved was coated on the silicon substrate on which graphene was formed at a rate of 1,000 rpm for 60 seconds, and then a UV tape was attached thereon. Then, by using a weak adhesive force between the SiO₂ and the copper film, the copper film/graphene/copper film/graphene/PMMA/UV tape stack was separated from the silicon substrate.

Then, the copper film/graphene/copper film/graphene/PMMA/UV tape stack was immersed in an etchant (CE-100, manufactured by Transene Co. Inc) for 1 hour to remove the copper films, thereby producing a UV tape/PMMA/graphene double-layer stack.

Then, the UV tape/PMMA/graphene double-layer stack was transferred on a SiO₂ substrate while the graphene contacted the SiO₂ substrate, and then PMMA was removed using acetone, thereby forming the graphene double-layer on the SiO₂ substrate.

Comparative Example 1

Copper was deposited by sputtering on a 2 cm×2 cm silicon substrate on which SiO₂ was coated to a thickness of 100 nm, thereby forming a copper film having a thickness of 2 μm. The silicon substrate on which SiO₂ and the copper film were deposited was placed in a chamber, and heat treated with 4 sccm of H₂ at a temperature of 1,000° C. for 30 minutes, and then 20 sccm of CH₄ and 4 sccm of H₂ were loaded thereinto for 30 minutes, and the inside of the chamber was naturally cooled to form a mono-layer graphene having a size of 2 cm×2 cm.

Then, a chlorobenzene solution (5 wt. %) in which PMMA was dissolved was coated on the silicon substrate on which graphene was formed at a rate of 1,000 rpm for 60 seconds, and then a UV tape was attached thereon. Then, by using a weak adhesive force between the SiO₂ and the copper film, the copper film/graphene/PMMA/UV tape stack was separated from the silicon substrate.

Then, the copper film/graphene/PMMA/UV tape stack was immersed in an etchant (CE-100, manufactured by Transene Co. Inc) for 1 hour to remove the copper film, thereby producing a UV tape/PMMA/mono-layer graphene stack.

Then, the UV tape/PMMA/mono-layer graphene stack was transferred on a SiO₂ substrate while the graphene contacted the SiO₂ substrate, and then PMMA was removed using acetone, thereby forming the mono-layer graphene on the SiO₂ substrate.

As described above, one or more example embodiments provide a method of forming a multi-layer graphene economically without defects or residues, a method of forming a patterned multi-layer graphene, and a method of transferring the patterned multi-layer graphene more easily on a substrate. Accordingly, a patterned multi-layer graphene for use in various electrical devices, e.g., display devices, transparent electrodes, wirings, and/or transistors, may be formed more easily and economically.

It should be understood that example embodiments described herein should be considered in a descriptive sense only and not for purposes of limitation. Descriptions of features or aspects within each example embodiment should typically be considered as available for other similar features or aspects in other example embodiments.

What is claimed is:

1. A method of forming a multi-layer graphene, the method comprising:
    forming a stack of a graphitizing metal catalyst layer and graphene by repeatedly performing a cycle of first forming the graphitizing metal catalyst layer on a substrate, and then forming the graphene on the graphitizing metal catalyst layer; and
    removing the graphitizing metal catalyst layer.

2. The method of claim 1, wherein the forming a stack forms the graphitizing metal catalyst layer at a thickness from about 100 nm to about 1000 nm.

3. The method of claim 1, wherein the forming a stack forms the graphitizing metal catalyst layer including at least one of nickel (Ni), cobalt (Co), iron (Fe), platinum (Pt), gold (Au), aluminum (Al), chromium (Cr), palladium (Pd), copper (Cu), magnesium (Mg), manganese (Mn), molybdenum (Mo), rhodium (Rh), silicon (Si), tantalum (Ta), titanium (Ti), tungsten (W), uranium (U), vanadium (V), and zirconium (Zr), and an alloy of two or more thereof.

4. The method of claim 1, wherein the forming a stack comprises:
    placing the substrate into a chamber, the substrate including the graphitizing metal catalyst layer formed thereon; and simultaneously providing a vaporous carbon supplier to the chamber and heat treating the graphitizing metal catalyst layer.

5. The method of claim 1, wherein the repeatedly performing a cycle includes forming the graphitizing metal catalyst layer and forming the graphene from about 2 to about 100 times.

6. A method of forming a multi-layer graphene, the method comprising:
- forming a stack of a graphitizing metal catalyst layer and graphene by repeatedly performing a cycle of first forming the graphitizing metal catalyst layer over a first substrate, and then forming the graphene on the graphitizing metal catalyst layer;
- forming a polymer support on the graphene;
- separating the stack of the graphitizing metal catalyst layer and the graphene and the polymer support from the first substrate;
- removing the graphitizing metal catalyst layer to form a stack of the graphene and the polymer support;
- transferring the stack of the graphene and the polymer support onto a second substrate; and
- removing the polymer support.

7. The method of claim 6, wherein the forming a polymer support forms polymethylmethacrylate.

8. The method of claim 6, wherein the separating includes using a tape.

9. The method of claim 6, wherein the repeatedly performing a cycle includes forming the graphitizing metal catalyst layer and forming the graphene from about 2 to about 100 times.

10. The method of claim 6, wherein the transferring transfers the stack of the graphene and the polymer support onto an insulating substrate.

11. A method of forming a multi-layer graphene, the method comprising:
- forming a block layer on a substrate;
- patterning the block layer to form a patterned block layer;
- forming a stack of a graphitizing metal catalyst layer and graphene by repeatedly performing a cycle of first forming the graphitizing metal catalyst layer over the patterned block layer and then forming the graphene on the graphitizing metal catalyst layer;
- removing the patterned block layer; and
- removing the graphitizing metal catalyst layer.

12. The method of claim 11, wherein the forming a block layer forms at least one of $SiO_2$, TiN, $Al_2O_3$, $TiO_2$, and $Si_3N_4$.

13. The method of claim 11, wherein the removing the graphitizing metal catalyst layer includes an acid treatment.

14. A method of forming a patterned multi-layer graphene, the method comprising:
- forming a block layer on a first substrate;
- patterning the block layer to form a patterned block layer;
- forming a stack of a graphitizing metal catalyst layer and graphene by repeatedly performing a cycle of first forming the graphitizing metal catalyst layer over the first substrate including the patterned block layer formed thereon and then forming the graphene on the graphitizing metal catalyst layer;
- removing the patterned block layer;
- forming a polymer support on the graphene;
- separating the stack of the graphitizing metal catalyst layer and the graphene and the polymer support from the first substrate;
- removing the graphitizing metal catalyst layer;
- transferring the stack of the graphene and the polymer support onto a second substrate; and
- removing the polymer support.

* * * * *